(12) United States Patent
Shirley et al.

(10) Patent No.: US 6,817,057 B2
(45) Date of Patent: Nov. 16, 2004

(54) SPINDLE CHUCK CLEANER

(75) Inventors: Paul Shirley, Meridian, ID (US); Craig Hickman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 254 days.

(21) Appl. No.: 09/945,121

(22) Filed: Aug. 30, 2001

(65) Prior Publication Data

US 2003/0046786 A1 Mar. 13, 2003

(51) Int. Cl.⁷ .......................... B08B 1/00; B08B 11/00; B08B 5/04
(52) U.S. Cl. ............................................. 15/301; 15/77
(58) Field of Search .......................... 15/77, 88.2, 88.3, 15/97.1, 102, 301, 302, 303, 306.1, 309.2, 308, 316.1

(56) References Cited

U.S. PATENT DOCUMENTS

| | | | | |
|---|---|---|---|---|
| 5,860,178 A | * | 1/1999 | Nishimura et al. | 15/77 |
| 6,019,663 A | | 2/2000 | Angell et al. | 451/5 |
| 6,286,525 B1 | * | 9/2001 | Nishimura et al. | 134/95.3 |
| 6,330,728 B2 | * | 12/2001 | Ueki et al. | 15/77 |
| 6,379,469 B1 | * | 4/2002 | Tanaka et al. | 134/6 |
| 2003/0037400 A1 | * | 2/2003 | Hunter et al. | 15/306.1 |

FOREIGN PATENT DOCUMENTS

| | | | |
|---|---|---|---|
| JP | 64-11684 | * | 1/1989 |
| JP | 2000-33346 | * | 2/2000 |
| JP | 2003-77987 | * | 3/2003 |

OTHER PUBLICATIONS

Van Zant, Peter, "Microchip fabrication : a practical guide to semiconductor processing", *4th Edition, New York : McGraw–Hill*, Chapter 4 & Chapters 8–9,(2000),87–132 & 193–280.

* cited by examiner

*Primary Examiner*—Terrence R. Till
(74) *Attorney, Agent, or Firm*—Schwegman, Lundberg, Woessner & Kluth, P.A.

(57) ABSTRACT

Wafer holder cleaning devices, systems and methods that are capable of removing contaminants from a wafer holder. An embodiment includes a particle removal surface on the cleaning device. An embodiment of the surface is a brush. An embodiment includes moving the surface into contact with the wafer holder. An embodiment includes moving the surface into a close, non-contacting relationship to the wafer holder. An embodiment includes a vacuum removing the particles from the wafer holder. In an embodiment, the wafer holder is a spindle chuck. In an embodiment, the spindle chuck is in a fabrication station. In an embodiment, one of the cleaning device and wafer holder rotates.

82 Claims, 6 Drawing Sheets

SPINDLE CHUCK CLEANER

TECHNICAL FIELD

The present invention relates generally to integrated circuit manufacturing equipment, and in particular to apparatus for cleaning wafer holders, such as chucks, in such equipment.

BACKGROUND

Manufacturing of integrated circuits requires a clean environment to control contaminates, which may come into contact with wafers and circuits. Contaminants may result in defective circuits. As a result, manufacturing takes place in clean rooms, which are essentially purified spaces with ultraclean air that isolates the circuit manufacturing from potential contaminants in ambient air. Potential contaminants include particles, metals, organic molecules, and the like. A clean room includes devices and procedures to ensure contaminant free manufacturing environment as much as possible. Discussions of clean room technologies can be found in MICROCHIP FABRICATION, Fourth Edition, Chap. 5, pages 87–132, by Peter Van Zant, herein incorporated by reference.

Particles can cause defects during the fabrication process leading to open or shorted circuitry. A conventional rule for acceptable particle size is one-half the feature size. Thus, as the feature size decreases then the acceptable particle size also decreases. One conventional method for removing particles from some wafer handling equipment is to shut off the fabrication process and manually clean the equipment. This method requires a significant shutdown time of the processing equipment. Moreover, if clean protocols are not strictly adhered to by the technician cleaning the equipment, then the wafer fabrication environment and wafer handling equipment may have more contaminants after the manual cleaning.

One particular step in the manufacturing process where particle contaminants may cause defects is during photolithography. Referring to FIG. 1, there is shown a partial view of a wafer 100 held on a wafer support 105 in a wafer exposure tool 106 such as a photolithography device. Exposure tool 106 is designed to exposure a planar top surface of the wafer to light 107. A contaminant particle 108 is positioned between the wafer and the support 105. The particle 108 causes the wafer 100 to bow as show at 109 such that it does not have a planar top surface. This results in the light 107 from exposure tool 106 not being focused on the top surface of the wafer at the bowed area 109. Accordingly, the exposure tool may not properly expose the wafer top surface. For example, the wafer could bow upward about 0.2 microns resulting improper exposure of this area of the wafer. This could result in defective resist formation and in defects in the subsequently formed structures on the wafer.

For the reasons stated above, for other reasons stated below, and for other reasons which will become apparent to those skilled in the art upon reading and understanding the present specification, there is a need in the art for improved integrated circuit manufacturing equipment and methods of manufacturing integrated circuits.

SUMMARY

An embodiment of the present invention includes a wafer handler engaging device and a particle removal surface on the device. The particle removal surface removes particles from a wafer handler. In an embodiment, the wafer handler is a chuck. In an embodiment, the wafer handler is a spindle chuck. In an embodiment, the wafer handler engaging device includes an arm for moving the particle removal surface into contact with a face of a wafer handler. In an embodiment, the wafer handler engaging device includes a spin drive for rotating the particle removal surface relative to the arm. In an embodiment, the arm includes a joint. In an embodiment, the arm includes a fixed support and the joint pivots the particle removal surface relative to the fixed support. In an embodiment, the wafer handler engaging device includes a spin drive for rotating the particle removal surface. In an embodiment, the spin drive rotates the particle removal surface relative to the wafer handler. In an embodiment, a vacuum source is provided for removing the particle from the environment of the wafer handler. In an embodiment, pathways extend through the wafer handler engaging device and connect to the vacuum source, the pathways including ports at the particle removal surface. In an embodiment, the particle removal surface includes a ceramic. In an embodiment, the particle removal surface includes a brush.

An embodiment of the present invention includes a track system for handling and/or processing wafers. The track system includes a spindle chuck assembly and an automated spindle chuck cleaner capable of cleaning the spindle chuck assembly. In an embodiment, the spindle chuck assembly includes a wafer holding head, and the spindle chuck cleaner cleans the head. In an embodiment, the automated spindle chuck cleaner includes a ceramic surface that contacts the head to remove particles therefrom. In an embodiment, the automated spindle chuck cleaner includes a brush that contacts the head to remove particles therefrom.

An embodiment of the present invention includes a wafer processing system, which includes a spindle chuck, an automated spindle chuck cleaner, and an alignment and exposure device. In an embodiment, the alignment and exposure device is a stepper. In an embodiment, the alignment and exposure device is a step and scan device. In an embodiment, the alignment and exposure device is a scanner. In an embodiment, the spindle chuck includes a wafer holding head, and the spindle chuck cleaner cleans the head. In an embodiment, the automated spindle chuck cleaner includes a ceramic surface or a brush. In an embodiment, the automated spindle chuck cleaner includes a vacuum source that is adjacent the head to remove at least one particle therefrom. In an embodiment, the track unit includes a plurality of track devices, each including at least one spindle chuck.

An embodiment of the present invention includes a controller for controlling the wafer holder and the wafer holder cleaner. In an embodiment, the controller includes a processor and communicates with the elements of a wafer processing system. In an embodiment, the instructions for operation of the wafer processing system, including the wafer holder cleaner, are stored on a machine readable media. In an embodiment, the instructions include moving the cleaning surface into contact with the head and removing contaminants from the head.

An embodiment of the present invention includes methods for cleaning a wafer holder, such as a chuck. An embodiment includes moving the cleaning surface into contact with the head and removing contaminants from the head. An embodiment includes placing a wafer on a head of a spindle chuck, performing a fabrication process on the wafer, removing the wafer from the head, and automatically cleaning contaminants from the head. An embodiment includes returning the wafer to head.

Further embodiments of the present invention will be apparent to one of ordinary skill upon reading the present disclosure.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

Figure 1:
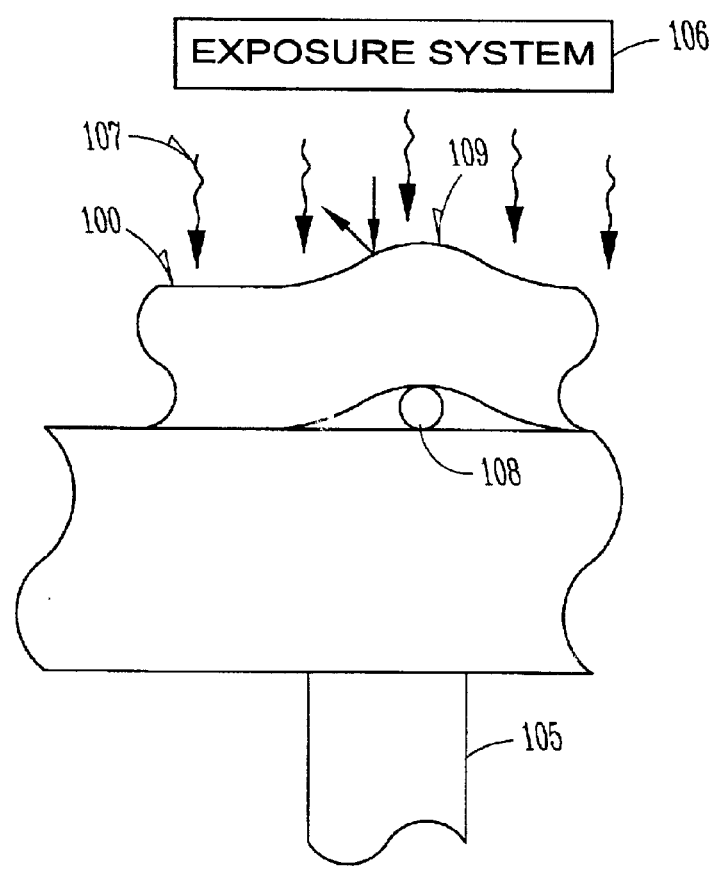
FIG. 1 is an enlarged partial view of a conventional stepper chuck.
Figure 2:
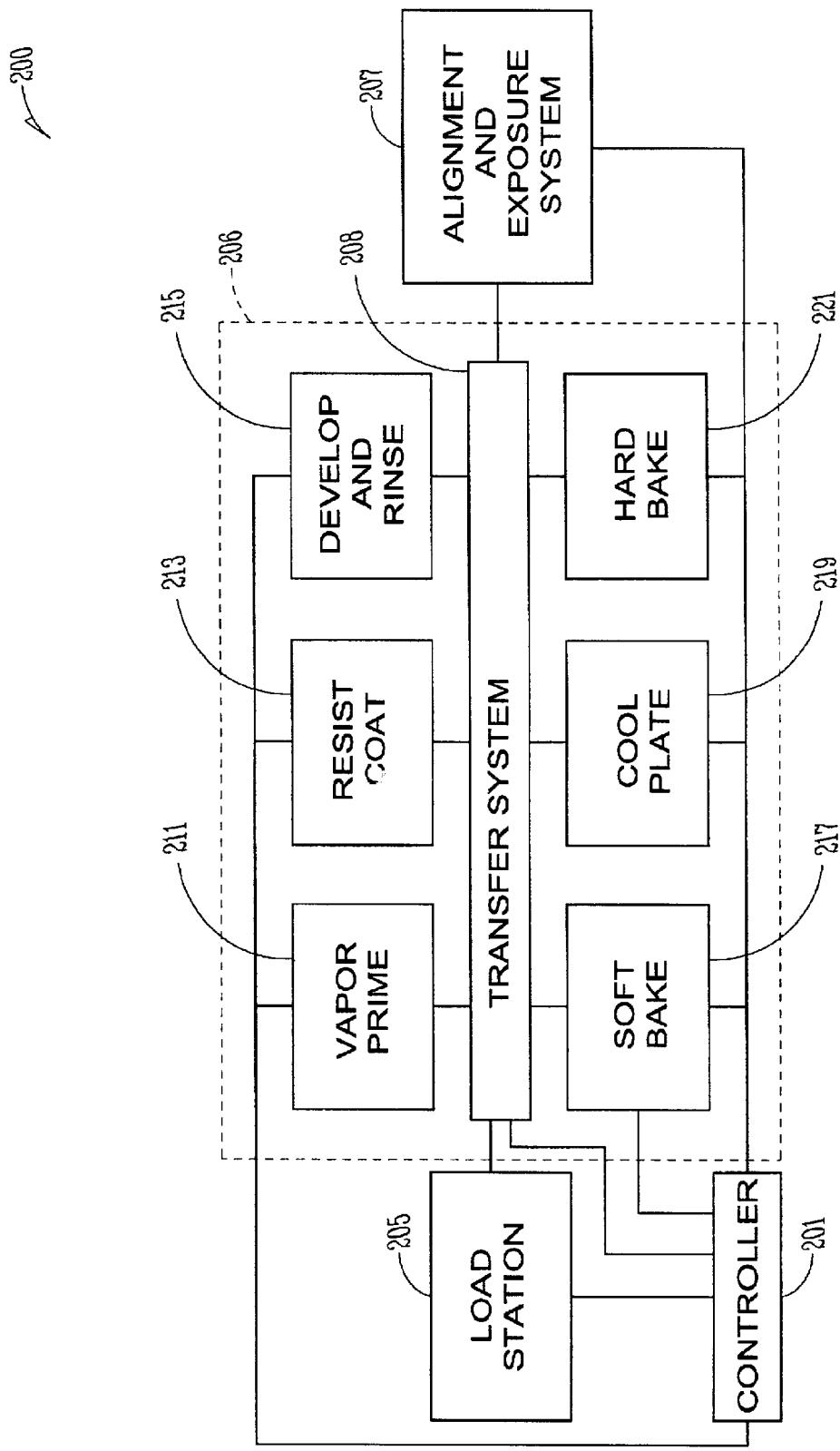
FIG. 2 is schematic view of integrated circuit manufacturing equipment.

FIG. 2 shows a integrated circuit fabrication apparatus 200 that is adapted to process and to handle wafers. Wafers typically include a plurality of separate dies each including a plurality of circuits devices and/or integrated circuits therein. Fabrication apparatus 200 includes a controller 201, a load station 205 connected to a fabrication station 206, which in turn is connected to an alignment and exposure system 207. Load station 205 typically receives wafers in batches from previous fabrication stations and includes robotic handling equipment to minimize particle generation and wafer damage. Fabrication station 206 receives wafers from load station 205 via a transfer system 208. The transfer system 208 includes at least one robotic wafer transferring unit that removes a wafer from load station 205 and transfers the wafer to the fabrication station 206. The transfer system 208 also moves wafers between various wafer processors of the fabrication station 206. The wafer processors of the fabrication station 206 include, and are not limited to, a primer 211, a resist coating unit 213, a developing unit 215, a soft bake unit 217, a cooling plate 219 and a post exposure bake unit 221. At least one of these wafer processors includes a chuck for holding a wafer during the respective fabrication process. The processes performed by these wafer processors are generally described in MICROCHIP FABRICATION, Fourth Edition, Chaps. 8 and 9, pages 193–280, by Peter Van Zant, herein incorporated by reference. In an embodiment, the transfer system 208 includes a plurality of robotic wafer transferring units.

The alignment and exposure system 207 receives wafers from the fabrication station 206 via the transfer system 208. In an embodiment, a plurality of fabrication stations and transfer systems 208 supply the alignment and exposure system 207. In an embodiment, system 207 is a photolithography device, which projects and exposes a mask pattern onto a resist-coated wafer. Generally, such a system includes a light source, an optical system, a reticle with a die pattern, and an alignment system. In an embodiment, the system 107 is a step and repeat aligner, commonly referred to as a "stepper". A stepper aligns and exposes successive reticle patterns by moving from one exposure site to the next site on the resist coated surface of the wafer. In another embodiment the system 107 is a step and scan system. In an embodiment, the system 107 is scanning projection aligner. In an embodiment, the system is a proximity aligner.

Controller 201 is electrically connected to the load station 205, fabrication station 206, alignment and exposure system 207, and transfer system 208. The controller includes a processor, e.g. a microprocessor, connected to a memory. In an embodiment, the memory is an integrated circuit, such as DRAM, SRAM and the like. In an embodiment, the memory is a machine readable media such a magnetic device, electromagnetic device, optical device or the like. Examples of magnetic devices include magnetic disks and tape capable of storing bits representing data. Examples of optical device include compact disks and other optical media readable by a machine. One task of the controller 201 is to time the operation of each unit of the wafer fabrication system 200. For example, controller 201 operates the transfer system 208, e.g., robots capable of transferring wafers, to move wafers between the units of the fabrication station 206. Moreover, the controller 201 controls the transfer system 208 to move the wafers from the fabrication station 206 into the alignment and exposure system 207.

Figure 3:
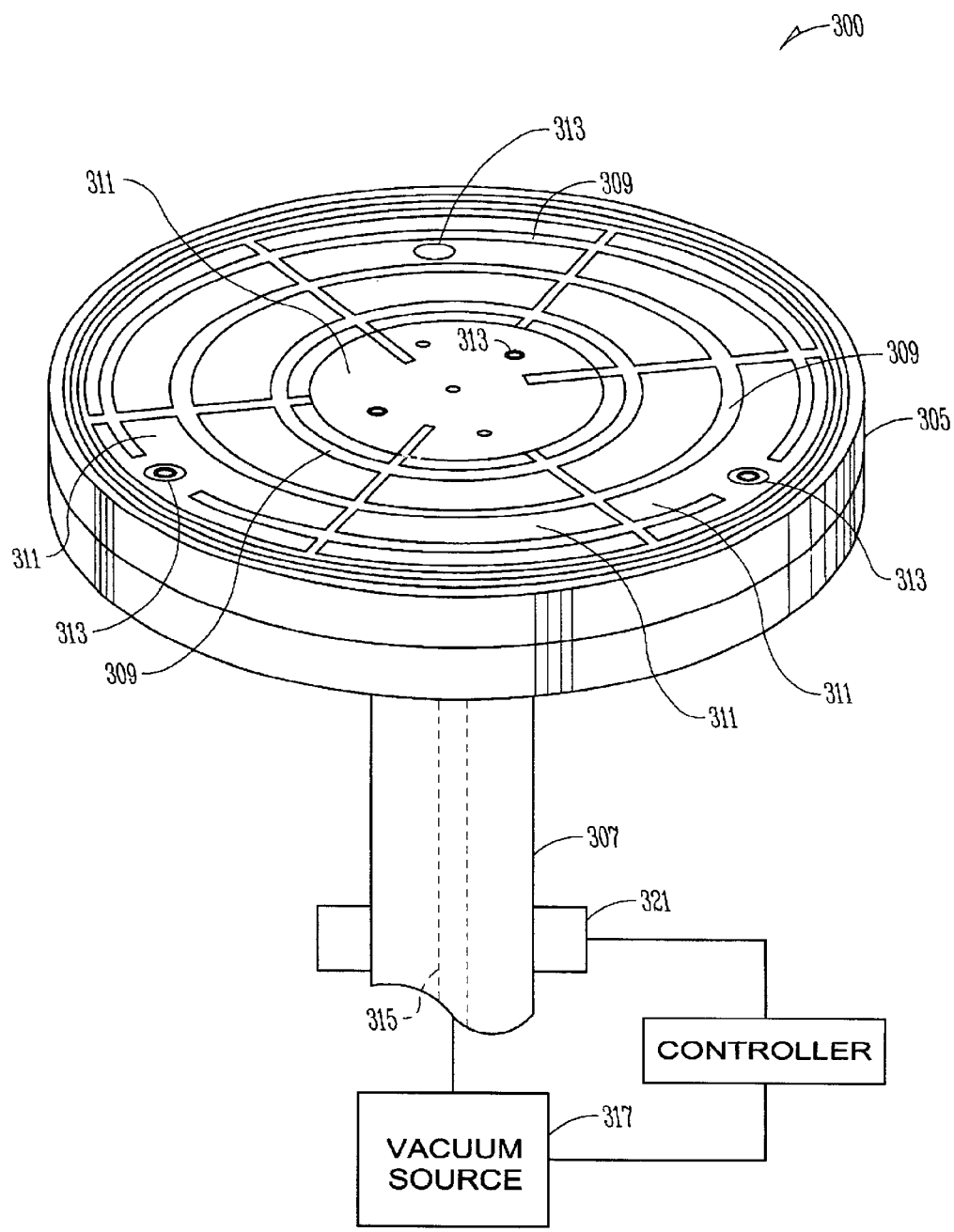
FIG. 3 is a view of a spindle chuck assembly.

FIG. 3 shows an embodiment of a wafer holder 300, which is positioned in the fabrication station 206. The wafer holder 300 includes a head or chuck 305 fixed at the top end of a vertical spindle 307. It will be understood that the wafer holder 300 is sometimes referred to as a spindle chuck. The head 305 has a wafer engaging profile, which, in an embodiment, includes a plurality of upraised ridges 309 and a plurality valleys 311 intermediate the ridges. In at least one of the valleys 311, a port 313 opens into the at least one valley 311. The port 313 is connected to pathways 315 embedded in the head 305. The pathways 315 extend through the spindle 307 and are connected to a vacuum source 317. In one embodiment, there are a plurality of ports 313 connected to the pathways 315. In the illustrated embodiment, there are two inner ports 313 in the central valley 311 and three outer ports 313 in respective outer valleys. The vacuum source 317 supplies a vacuum through pathways 315 and ports 313 to fixedly hold a wafer positioned on the head 305. In an embodiment, the ridges 309 are pins or posts on which the wafer rests when positioned on the chuck. In an embodiment, the chuck 305 is a hollow, essentially flat disc with hole or ports 313 therein. The chuck 305, in an embodiment, has a smaller diameter than the wafers it supports. The spindle 307 is engaged by a spin motor 321 which rotates the spindle and chuck at a variable rpm. The spin motor 321 can spin the spindle and chuck at up to about 50,000 rpm. In an embodiment, the spin motor 321 spins the spindle and chuck at up to about 10,000 rpm. In an embodiment, the spin motor 321 spins the spindle and chuck at about 5,000 rpm. In an embodiment, the spin motor 321 spins the spindle and chuck at about 1,000 rpm. The spin motor 321 and vacuum source 317 are both connected and controlled by controller 301.

The chuck 305 includes a wafer supporting upper surface. In an embodiment, this surface is a metal surface. In an embodiment, this surface is a steel surface. In an embodiment, the surface is a plastic. In an embodiment, the surface is polyetheretherketone (PEEK). In an embodiment, the surface includes TEFLON™. In an embodiment, the surface includes DELRIN™.

Figure 4:
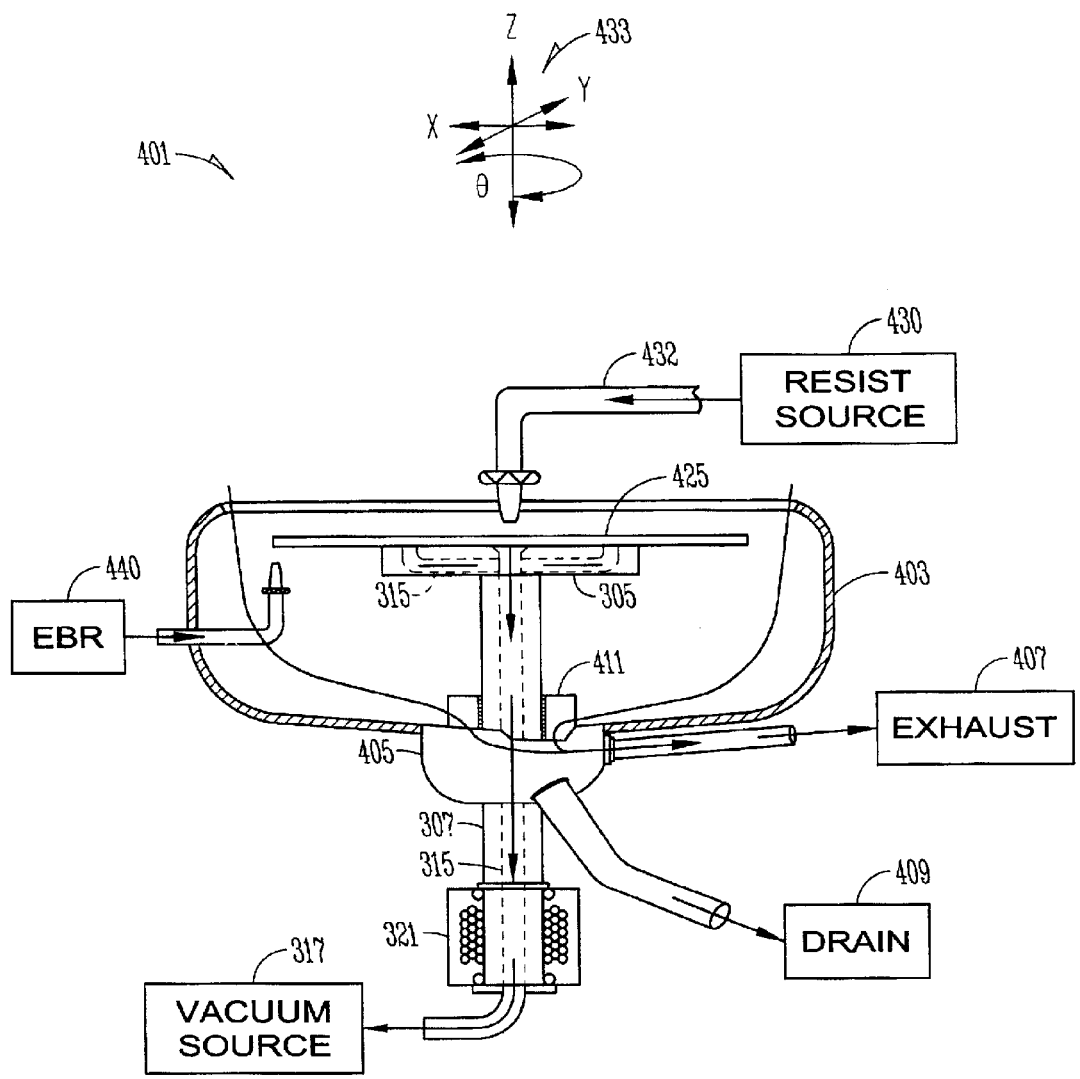
FIG. 4 is a view of another embodiment of a spindle chuck assembly.

FIG. 4 shows an embodiment of the wafer holder 300 that is adapted for use in the resist coat unit 213 of FIG. 2. Wafer holder 300 is positioned in a bowl assembly 401 including a bowl 403 surrounding the head 305 and an upper portion of shaft 307. The shaft 307 extends through a base 405 of bowl 403 and journals into spin motor 321. A vapor exhaust 407 and liquid drain 409 are fluidly connected to the base 405. The base 405 has a journal 411, such as a sealed bearing, supporting shaft 307. A wafer 425 is fixed to the upper surface of chuck 305 by the vacuum supplied by vacuum source 317 as described herein. A resist source 430 includes a nozzle 432 that applies resist to a upper surface of the wafer 425. The nozzle 432, in an embodiment, is static or fixed relative to the wafer 425 and chuck 305. The nozzle 432, in an embodiment, is movable relative to the wafer 425 and chuck 305. For example, the nozzle 432 is movable in up to four directions as indicated at 433. This allows the resist to be deposited in any desired pattern on the wafer 425. An edge bead remover 440 extends into the bowl 403 and has a nozzle adjacent the edge of the wafer as held by the chuck 305. One of ordinary skill in the art will understand the operation of the resist source 430 and edge bead remover 440. The resist source 430, nozzle 432, edge bead remover 440, exhaust 407, and drain 409 are all connected to and controlled by controller 201 or 301.

Figure 5:
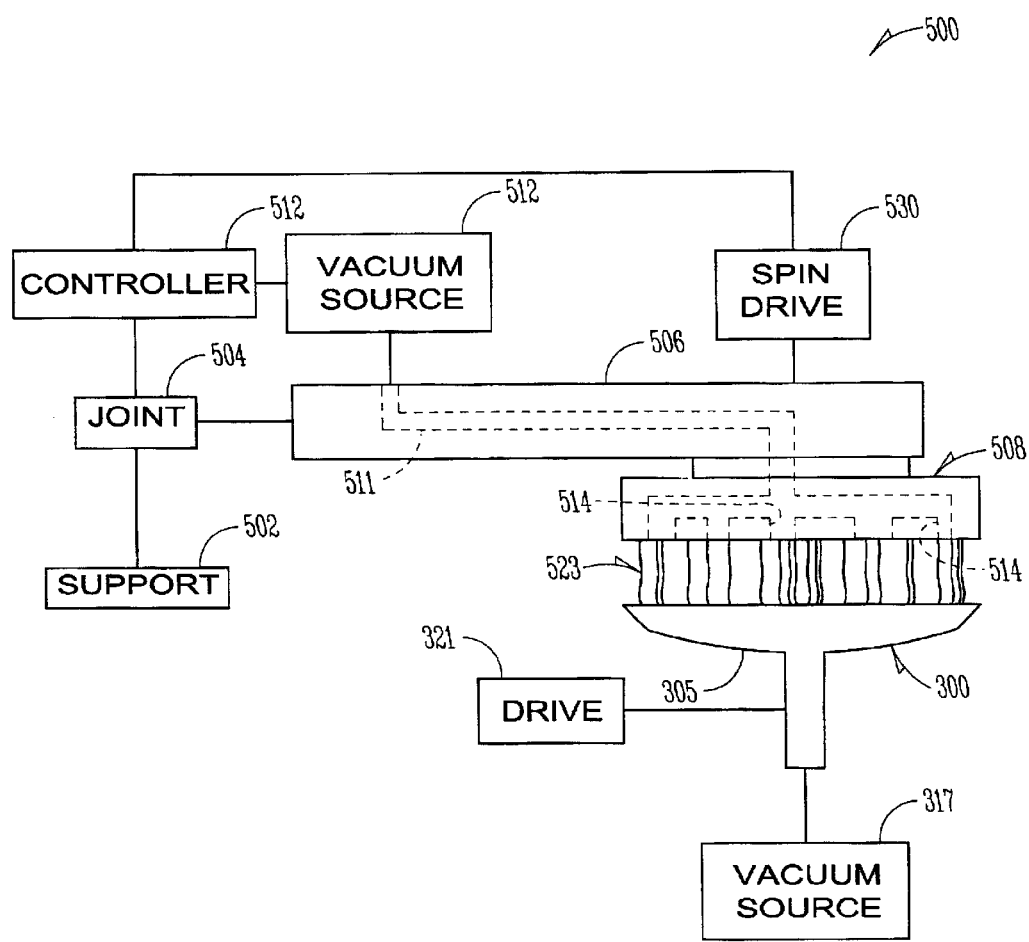
FIG. 5 is a view of a spindle chuck cleaner according to an embodiment of the present invention.
Figure 6:
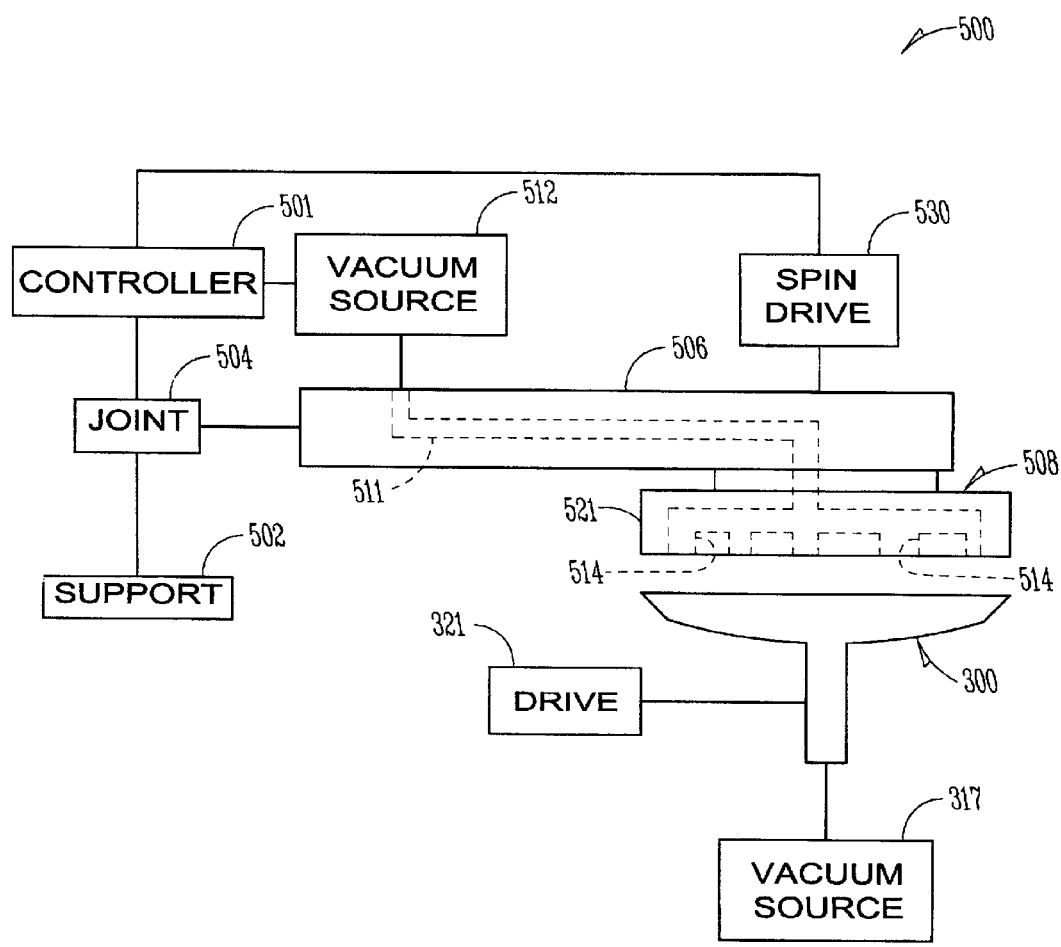
FIG. 6 is a view of a spindle chuck cleaner according to an embodiment of the present invention.

FIGS. 5 and 6 show a wafer holder cleaning apparatus 500 and a wafer holder 300, which in the illustrated embodiment is shown as a spindle chuck, according to the teachings of the present invention. Apparatus 500 includes a support 502 connected to the unit of the fabrication station 206 in which the wafer holder 300 is positioned. In an embodiment, the support 502 is fixed to the unit of the fabrication station. In an embodiment, the support 502 is a wafer handling robot of the transfer system 208. In an embodiment, the support 502 is an arm of a wafer handling robot. A movable joint 504 connects a proximal end of arm 506 to the support 502. A cleaning head assembly 508 is connected to a distal end of arm 506 and is capable of removing contaminants from a wafer holder. In an embodiment, the wafer holder 300 is harder then the cleaning assembly 508. In an embodiment, the joint 504 moves the arm 506 and cleaning head assembly 508 vertically. In an embodiment, the joint 504 moves the arm 506 and cleaning head assembly 508 both vertically and rotationally. In an embodiment, the joint 504 moves the arm 506 and cleaning head assembly 508 in the X, Y, and Z directions. In an embodiment, the joint 504 includes motors, such as stepper motors, and actuators, such as fluid, e.g. hydraulic and pneumatic, actuators to move the arm 506 and assembly 508.

The arm 506 includes fluid pathways 511 connected at one end thereof to a vacuum source 512. The pathways 511 extend through the arm 506 and open at ports 514 in a face of the cleaning head assembly 508. The cleaning head assembly 508 includes, in an embodiment, a base 521 that has the pathways 511 and ports 514 extending therein. The vacuum source 512 through pathways 511 and ports 514 removes contaminants or particles from the volume adjacent the face of chuck 305.

In an embodiment, the assembly 508 includes a brush 523 fixed on the face of base 521 (FIG. 5). In an embodiment, the brush 523 includes at least one bristle. In an embodiment, the brush includes a plurality of bristles. The bristles, in an embodiment, are formed of polytetrafluoroethylene, which is sold under the trademark TEFLON. The bristles, in an embodiment, are formed of nylon. The bristles, in an embodiment, are formed of plastic. The brush 523 extends downwardly from the base 521. Brush 523 is adapted to contact the chuck 305 and separate contaminants from the chuck, which can then be vacuumed into ports 514.

In an embodiment, the wafer cleaning apparatus 500 includes a spin motor 530. The spin motor 530 is operably connected to the base 521 and is adapted to rotate it. In an embodiment, the spin motor is substantially similar to the spin motor 321 as described herein. In an embodiment, the spin motor 530 is remote from the base 521 and rotates it through a drive train (not shown).

Controller 501 is connected to controls operation of the cleaning apparatus 500. In an embodiment, controller 201 is operably connected to the joint 504. The joint 504 moves the cleaning assembly 508 into alignment with the chuck's upper face based on control signals from the controller.

FIG. 6 shows an embodiment similar to FIG. 5. However, the FIG. 6 embodiment does not have a brush mounted on the cleaning assembly 508. In an embodiment, the assembly 508 is moved closely adjacent the chuck 305. Contaminants, e.g., particles, are vacuumed off the chuck surface by the vacuum source 512 through the ports 514 and pathways 511. In an embodiment, the base 521 of assembly 508 has a surface facing the chuck 523. In an embodiment, the base surface is positioned about 0.4 microns from the chuck surface. In an embodiment, the base surface is positioned greater than 0.2 microns from the chuck surface. In an embodiment, the surface is positioned about 0.6 microns from the chuck surface. In an embodiment, the base 521 contacts the chuck surface. According to the teachings of present invention, base 521 scrubs contaminants off the chuck surface. In an embodiment, the removed contaminants, e.g., particles, are vacuumed by the vacuum source 512 through the ports 514 and pathways 511. In an embodiment, the base 521 contacts the particles on the chuck surface.

In an embodiment, the minimum acceptable size particle that can cause an out of focus exposure in the alignment and exposure system 207 is determined. It will be appreciated that the minimum particle size depends on the minimum line width created by system 207 and the wavelength of the exposure light. One of ordinary skill in the art will understand further variables on which the minimum acceptable particle size depends. The surface of the base 521 is moved to a position adjacent the wafer holding surface of the chuck. In an embodiment, the base surface is spaced from the chuck surface less than the minimum particle size. The surface of the base 521 contacts the particles but does not contact the chuck surface. Accordingly, base 521 scrubs particles off the chuck surface with contacting or directly abrading the chuck surface. In an embodiment, the removed particles are vacuumed by the vacuum source 512 through the ports 514 and pathways 511. In an embodiment, the removed particles are exhausted from the environment of the spindle chuck 300 using the filtration system of the fabrication station 206. In an embodiment, the filtration system includes the exhaust 407 of the bowl assembly 401.

In operation, the load station 205 receives batches of wafers from previous fabrication stations. Contaminants, e.g., particles, may be on the back sides of the wafers. The wafer handling robotic units of the transfer system 208 remove the wafers from the load station 205 and move them into fabrication units 211, 213, 215, 217, 219, and 221 according to processing requirements as would be understood by one of ordinary skill. Contaminants may move back and forth between wafers by being removed from the backside of a wafer, adhering to the wafer handlers of the transfer system and adhering to a subsequent wafer transported by the wafer handlers. Another source of contaminants for an individual wafer is the chucks or the plates in the fabrication units. A contaminant may be left behind in the fabrication unit by a wafer and adhere to the back side of a subsequent wafer. Accordingly, the present invention provides structure and methods for removing the contaminants from the wafer handlers, chucks and/or plates of the fabrication units.

An embodiment of the present invention is an automated cleaning structure or method. In this embodiment, the term "automated" refers to a non-manual cleaning procedure. The automated cleaning method is timed by a controller to clean the wafer handlers in between the fabrication steps. In an embodiment, whenever the chuck 305 is vacant, i.e., free of a wafer, the controller instructs the cleaning device, e.g., apparatus 500 to clean the chuck and, in particular, to clean the wafer engaging surface of the chuck.

In an embodiment, the cleaning device is connected to the robotic wafer handlers of the transfer system 208. In this embodiment, the chuck 305 must be vacant and the robotic wafer handler must not be needed for another task. Accordingly, the controller 201 is programmed with a hierarchy of tasks. More specifically, some tasks must be completed in a defined time period, such as transferring a wafer between various fabrication units. The controller 201 will instruct the wafer handler to perform such tasks before performing any cleaning tasks.

In an embodiment, the controller 201 further controls operation of the cleaning apparatus 500. The controller 201, after it determines that the wafer handler, such as chuck 305, is vacant, instructs the apparatus 500 to move its cleaning head 508 into alignment with the chuck. The head 508 is generally vertically aligned with the chuck 305. In an embodiment, the head 508 and chuck 305 are coaxial. In an embodiment, the controller 201 instructs the head 508 into contact with the chuck. The chuck 305 then rotates by activation of the spin motor 321 in an embodiment. In an embodiment, the cleaning head 508 rotates by activation of the spin drive 530. The controller 201 further controls activation of the vacuum source 512. In an embodiment, the vacuum source 512 generates a vacuum when the head 508 contacts the chuck 305. In an embodiment, the vacuum source 512 generates a vacuum when the head 508 is positioned adjacent the chuck 305. In an embodiment, the vacuum source 512 generates a vacuum when the head 508 is a set distance from the chuck 305. In an embodiment, the set distance is about 0.2 microns. In an embodiment, the set distance is less than about 0.2 microns. In an embodiment, the vacuum source 512 generates a vacuum when the head 508 is vertically aligned with the chuck 305.

In an embodiment, the controller 201 tracks and controls the movements of wafers in the fabrication station 206. When a wafer handler is vacant and enough time is left before the next wafer will be delivered to the wafer handler, then the controller instructs the cleaning apparatus to clean the wafer handler.

The present invention as described herein provides devices, systems and methods for cleaning a wafer holder. In an embodiment, the wafer holder is a spindle chuck. The device for cleaning the wafer holder is positioned in close proximity to or in contact with the wafer holder. In the embodiment of a spindle chuck, the spindle chuck could rotate to assist in dislodging contaminant particles from the surface of the spindle chuck. Devices, systems and methods of the present invention provide automatic cleaning of the wafer holder resulting in less fabrication equipment downtime, in greater fabrication throughput, and in reduction of the possibility of introducing contaminants into the fabrication environment. Accordingly, the wafer handlers can be cleaned with greater frequency than using the conventional manual techniques. This results in fewer defects in the integrated circuits. Examples of reduced defects include fewer defects produced when the exposure field is dropped due to particles on the backsides of wafers in the alignment and exposure tool. Moreover, the present invention is adaptable to existing fabrication equipment. For example, the cleaning device can be mounted in a resist coating unit or on a robotic wafer handler. It is also within the scope of the present invention to reprogram a controller that controls existing fabrication equipment. In an embodiment, software such as a cleaning subroutine is added to existing controller software. The software is stored on a machine readable media.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. Accordingly, this application is intended to cover any adaptations or variations of the invention. It is manifestly intended that this invention be limited only by the following claims and equivalents thereof.

What is claimed is:

1. A cleaning device for a spindle chuck, comprising:
    a spindle chuck engaging device; and
    a particle removal surface on the spindle chuck engaging device, the particle removal surface being adapted to remove a particle from a spindle chuck.

2. The device of claim 1, wherein the spindle chuck engaging device includes an arm for moving the particle removal surface into contact with a face of a spindle chuck.

3. The device of claim 2, wherein the spindle chuck engaging device includes a spin drive for rotating the particle removal surface relative to the arm.

4. The device of claim 2, wherein the arm includes a joint.

5. The device of claim 4, wherein the arm includes a fixed support and the pivots the particle removal surface relative to the fixed support.

6. The device of claim 1, wherein the spindle chuck engaging device includes a spin drive for rotating the particle removal surface.

7. The device of claim 6, wherein the spin drive rotates the particle removal surface relative to the spindle chuck.

8. A cleaning device for a spindle chuck in an environment, comprising:
    a spindle chuck engaging device;
    a particle removal surface on the spindle chuck engaging device, the particle removal surface being adapted to remove a particle from a spindle chuck; and a vacuum source for removing the particle from the environment of the spindle chuck.

9. The device of claim 8, wherein the spindle chuck engaging device includes an arm for moving the particle removal surface into contact with a face of a spindle chuck, wherein the arm includes vacuum pathways fluidly connected to the vacuum source.

10. The device of claim 9, wherein the spindle chuck engaging device includes a spin drive for rotating the particle removal surface relative to the arm.

11. The device of claim 9, wherein the arm includes a joint.

12. The device of claim 11, wherein the arm includes a fixed support, the joint pivots the particle removal surface relative to the fixed support, and the vacuum pathways remain fluidly connected with the particle removal surface being pivoted by the joint.

13. The device of claim 8, wherein the spindle chuck engaging device includes a spin drive for rotating the particle removal surface.

14. The device of claim 13, wherein the spin drive rotates the particle removal surface relative to the spindle chuck.

15. A cleaning device for a spindle chuck in an environment, comprising:
a spindle chuck engaging device;
a particle removal surface on the spindle chuck engaging device, the particle removal surface being adapted to remove a particle from a spindle chuck;
a vacuum source for removing the particle from the environment of the spindle chuck; and
pathways extending through the spindle engaging device and connected to the vacuum source, the pathways including ports at the particle removal surface.

16. The device of claim 15, wherein the spindle chuck engaging device includes an arm for moving the particle removal surface into contact with a face of a spindle chuck.

17. The device of claim 16, wherein the pathways extend through the arm.

18. The device of claim 17, wherein the spindle chuck engaging device includes a spin drive for rotating the particle removal surface relative to the arm.

19. The device of claim 18, wherein the spin drive rotates the particle removal surface relative to the spindle chuck and the ports are in close proximity to the surface of the spindle chuck to vacuum a particle removed from the spindle chuck by the particle removal surface.

20. The device of claim 16, wherein the arm includes a joint.

21. The device of claim 16, wherein the arm includes a fixed support, the joint pivots the particle removal surface relative to the fixed support, and the pathways remain fluidly connected with the particle removal surface being pivoted by the joint.

22. A cleaning device for a spindle chuck, comprising:
a spindle chuck engaging device; and
a particle removal, ceramic surface on the spindle chuck engaging device.

23. The device of claim 22, wherein the spindle chuck engaging device includes an arm for moving the ceramic surface into contact with a face of a spindle chuck.

24. The device of claim 22, wherein the spindle chuck engaging device includes a spin drive for rotating the ceramic surface relative to the arm.

25. The device of claim 24, wherein the arm includes a joint.

26. The device of claim 25, wherein the arm includes a fixed support and the joint pivots the ceramic surface relative to the fixed support.

27. A cleaning device for substrate handling equipment, comprising:
an engaging device adapted to engage a substrate support; and
a particle removal unit on the engaging device, wherein the particle removal unit includes bristles capable of contacting a face of the substrate support to remove a particle therefrom.

28. The cleaning device of claim 27, wherein the engaging device includes an arm for moving the bristles into contact with a face of a substrate support.

29. The cleaning device of claim 28, wherein the engaging device includes a spin drive for rotating the particle removal unit relative to the arm.

30. The cleaning device of claim 29, wherein the arm includes a joint.

31. The cleaning device of claim 30, wherein the arm includes a fixed support and the joint pivots the particle removal unit relative to the fixed support.

32. A cleaning device for a spindle chuck, comprising:
a spindle chuck engaging device;
a particle removal unit on the spindle chuck engaging device, wherein the particle removal unit includes:
a head;
bristles connected to the head and capable of contacting a face of the spindle chuck to remove a particle therefrom;
a vacuum source for removing the particle from the environment of spindle chuck; and
pathways extending through the head and connected to the vacuum source, the pathways including ports at a surface of the head.

33. The device of claim 32, wherein the spindle chuck engaging device includes an arm connected to the particle removal unit and capable of moving the particle removal unit into contact with a face of a spindle chuck.

34. The device of claim 33, wherein the spindle chuck engaging device includes an arm connected to the head and capable of moving the head into a position adjacent a face of a spindle chuck.

35. The device of claim 34, wherein the arm moves the ports adjacent a face of a spindle chuck such that a particle removed from the face is vacuumed into one of the ports.

36. The device of claim 33, wherein the spindle chuck engaging device includes an arm connected to the head and capable of moving the bristles into a contact with a face of a spindle chuck.

37. A track system for handling wafers, comprising:
a spindle chuck assembly; and
an automated spindle chuck cleaner capable of cleaning the spindle chuck assembly.

38. The system of claim 37, wherein the spindle chuck assembly includes a wafer holding head, and the spindle chuck cleaner cleans the head.

39. The system of claim 38, wherein the spindle chuck assembly includes a bowl having an open top, a spindle shaft extending upwardly into the bowl, a head on the shaft and positioned in the bowl.

40. The system of claim 38, wherein the automated spindle chuck cleaner includes a ceramic surface that contacts the head to remove at least one particle therefrom.

41. The system of claim 38, wherein the automated spindle chuck cleaner includes at least one bristle that contacts the head to remove at least one particle therefrom.

42. The system of claim 41, wherein the at least one bristle includes a plurality of bristles each adapted to contact the head.

43. The system of claim 38, wherein the automated spindle chuck cleaner includes a plurality of bristles each adapted to contact the head.

44. The system of claim 38, wherein the automated spindle chuck cleaner includes a vacuum source that is fluidly adjacent the head to remove at least one particle therefrom.

45. The system of claim 38, wherein the automated spindle chuck cleaner includes a ceramic surface that contacts the head to remove at least one particle from a surface of the spindle chuck assembly and a vacuum source that is adjacent the head to remove at least one particle from an environment of the spindle chuck assembly.

46. A The system of claim 38, wherein the spindle chuck assembly includes head for holding a wafer, a resist dispenser, a drain, and an exhaust.

47. The system of claim 46, wherein the spindle chuck assembly includes a vacuum source holding a wafer on the head.

48. The system of claim 46, wherein the resist dispenser includes a nozzle that is movable in at least three directions.

49. A track system for handling wafers, comprising:
a wafer processing unit including a spindle chuck; and
an automated spindle chuck cleaner.

50. The system of claim 49, wherein the spindle chuck includes a wafer holding head, and the spindle chuck cleaner cleans the head.

51. The system of claim 50, wherein the automated spindle chuck cleaner includes a ceramic surface that contacts the head to remove at least one particle therefrom.

52. The system of claim 50, wherein the automated spindle chuck cleaner includes at least one bristle that contacts the head to remove at least one particle therefrom.

53. The system of claim 52, wherein the automated spindle chuck cleaner includes a plurality of bristles each adapted to contact the head.

54. The system of claim 50, wherein the automated spindle chuck cleaner includes a vacuum source that is adjacent the head to remove at least one particle therefrom.

55. The system of claim 50, wherein the automated spindle chuck cleaner includes a ceramic surface that contacts the head to remove at least one particle from a surface of the spindle chuck and a vacuum source that is adjacent the head to remove at least one particle from an environment of the spindle chuck.

56. A track system for handling wafers, comprising:
a wafer processing unit including a wafer processing surface; and
an automated wafer processing surface cleaner.

57. The system of claim 56, wherein the wafer processing unit is a resist coat device.

58. The system of claim 56, wherein the wafer processing unit includes at least one of a group consisting essentially of a develop and rinse device, a spin coating device, and a resist coat device.

59. A track system for handling wafers, comprising:
a wafer processing unit including a wafer support; and
an automated wafer support cleaner adapted to non-manually clean contaminants from the wafer support.

60. The system of claim 59, wherein the wafer processing unit includes at least one of a group consisting essentially of a vapor priming device, a soft bake device, a post exposure bake device, and a cool plate device.

61. A wafer processing system, comprising:
a track unit including a spindle chuck;
an automated spindle chuck cleaner adapted to non-manually clean contaminants from the spindle chuck; and
an alignment and exposure device.

62. The system of claim 61, wherein the alignment and exposure device is a stepper.

63. The system of claim 61, wherein the alignment and exposure device is a step and scan device.

64. The system of claim 61, wherein the alignment and exposure device is a scanner.

65. The system of claim 61, wherein the spindle chuck includes a wafer holding head, and the spindle chuck cleaner cleans the head.

66. The system of claim 65, wherein the automated spindle chuck cleaner includes a ceramic surface that contacts the head to remove at least one particle therefrom.

67. The system of claim 65, wherein the automated spindle chuck cleaner includes at least one bristle that contacts the head to remove at least one particle therefrom.

68. The system of claim 65, wherein the automated spindle chuck cleaner includes a vacuum source that is adjacent the head to remove at least one particle therefrom.

69. The system of claim 61, wherein the track unit includes a plurality of track devices, each including at least one spindle chuck.

70. A track system for handling wafers, comprising:
a spindle chuck assembly including a head adapted to releasably hold a wafer;
an automated spindle chuck cleaner including a cleaning surface capable of cleaning the spindle chuck assembly; and
wherein the cleaning surface is harder than the head.

71. A track system for handling wafers, comprising:
a spindle chuck assembly including a head adapted to releasably hold a wafer,
an automated spindle chuck cleaner including a cleaning surface capable of cleaning the spindle chuck assembly; and
wherein the head is harder than the cleaning surface.

72. A system for handling wafers, comprising:
a wafer processing unit including a spindle chuck, wherein the spindle chuck includes a head formed of polyetheretherketone (PEEK); and
an automated spindle chuck cleaner adapted to non-manually clean the head.

73. The system of claim 72, wherein the spindle chuck cleaner includes a brush capable of contacting the head.

74. The system of claim 72, wherein the spindle chuck cleaner includes a ceramic surface capable of contacting the head.

75. The system of claim 74, wherein the spindle chuck cleaner includes a vacuum for removing contaminants from the PEEK head.

76. The system of claim 74, wherein the spindle chuck includes a rigid shaft fixedly connected to the head and a spin motor connected to the rigid shaft for rotating same.

77. A cleaning system for removing particles having a minimum acceptable size from integrated circuit fabrication equipment, comprising:
a chuck adapted to hold a wafer, the chuck having a particle thereon, the particle having at least the minimum acceptable size; and
a cleaning head positioned less than the minimum acceptable size from the chuck and capable of removing the particle from the chuck.

78. The system of claim 77, wherein the cleaning bead includes a base and a brush connected to the base, the brush having bristles cantilevered from the base, and the free ends of the bristles being less than the minimum acceptable size from the chuck.

79. The system of claim 77, wherein at least one of the chuck and cleaning head is connected to a motor capable of rotating the at least one of the chuck and cleaning head.

80. The system of claim 77, wherein the cleaning head has a vacuum source vacuuming the removed particles from an environment of the chuck.

81. The system of claim 77, wherein the cleaning head is positioned less than 0.2 microns from the chuck 82. A cleaning device for a spindle chuck, comprising:

a spindle chuck engaging device, wherein the spindle chuck engaging device includes a process surface engaging device; and a particle removal surface on the process surface engaging device, wherein the particle removal surface includes one from the group consisting of bristles capable of contacting a face of the processing surface to remove a particle therefrom and a ceramic surface.

* * * * *

UNITED STATES PATENT AND TRADEMARK OFFICE
CERTIFICATE OF CORRECTION

PATENT NO. : 6,817,057 B2
DATED : November 16, 2004
INVENTOR(S) : Shirley et al.

It is certified that error appears in the above-identified patent and that said Letters Patent is hereby corrected as shown below:

Column 8,
Line 55, insert -- joint -- before "pivots".

Column 10,
Line 29, after "of" insert -- the --.

Column 11,
Line 13, delete "A" before "The".

Column 12,
Line 34, after "wafer" delete "," and insert -- ; --, therefor.

Column 13,
Line 1, delete "bead" and insert -- head --, therefor.

Signed and Sealed this

Twenty-sixth Day of April, 2005

JON W. DUDAS
*Director of the United States Patent and Trademark Office*